United States Patent [19]

McClure

[11] Patent Number: 5,959,910
[45] Date of Patent: Sep. 28, 1999

[54] SENSE AMPLIFIER CONTROL OF A MEMORY DEVICE

[75] Inventor: David Charles McClure, Carrollton, Tex.

[73] Assignee: STMicroelectronics, Inc., Carrollton, Tex.

[21] Appl. No.: 08/844,696

[22] Filed: Apr. 25, 1997

[51] Int. Cl.⁶ .................................................. G11C 7/00
[52] U.S. Cl. .......................................... 365/201; 365/208
[58] Field of Search .................................... 365/201, 208, 365/233.5, 233

[56] References Cited

U.S. PATENT DOCUMENTS

| | | | |
|---|---|---|---|
| 5,455,798 | 10/1995 | McClure | 365/230.06 |
| 5,455,802 | 10/1995 | McClure | 365/233 |
| 5,485,430 | 1/1996 | McClure | 365/233 |
| 5,521,875 | 5/1996 | Callahan | 365/207 |
| 5,548,560 | 8/1996 | Stephens, Jr. et al. | 365/233.5 |
| 5,579,326 | 11/1996 | McClure | 371/61 |
| 5,615,158 | 3/1997 | Ochoa et al. | 365/201 |
| 5,619,466 | 4/1997 | McClure | 365/207 |

FOREIGN PATENT DOCUMENTS 2287326  9/1995  United Kingdom ............ G11C 29/00

*Primary Examiner*—David Nelms
*Assistant Examiner*—M. Tran
*Attorney, Agent, or Firm*—Theodore E. Galanthay; Lisa K. Jorgenson; Renee M. Larson

[57] ABSTRACT

A test mode of a memory device may be invoked that varies the sense amplifier clocking of the memory device as a function of manipulation of a control signal external to the memory device. At the appropriate logic state of a test mode enable signal, the test mode of the memory device is entered. Normal clocking of the sense amplifier is suspended during the test mode and the sense amplifier is clocked according to the transition of an external control signal from a first logic state to a second logic state. A predetermined period of time after the transition of the external control signal, the sense amplifier if clocked.

30 Claims, 3 Drawing Sheets

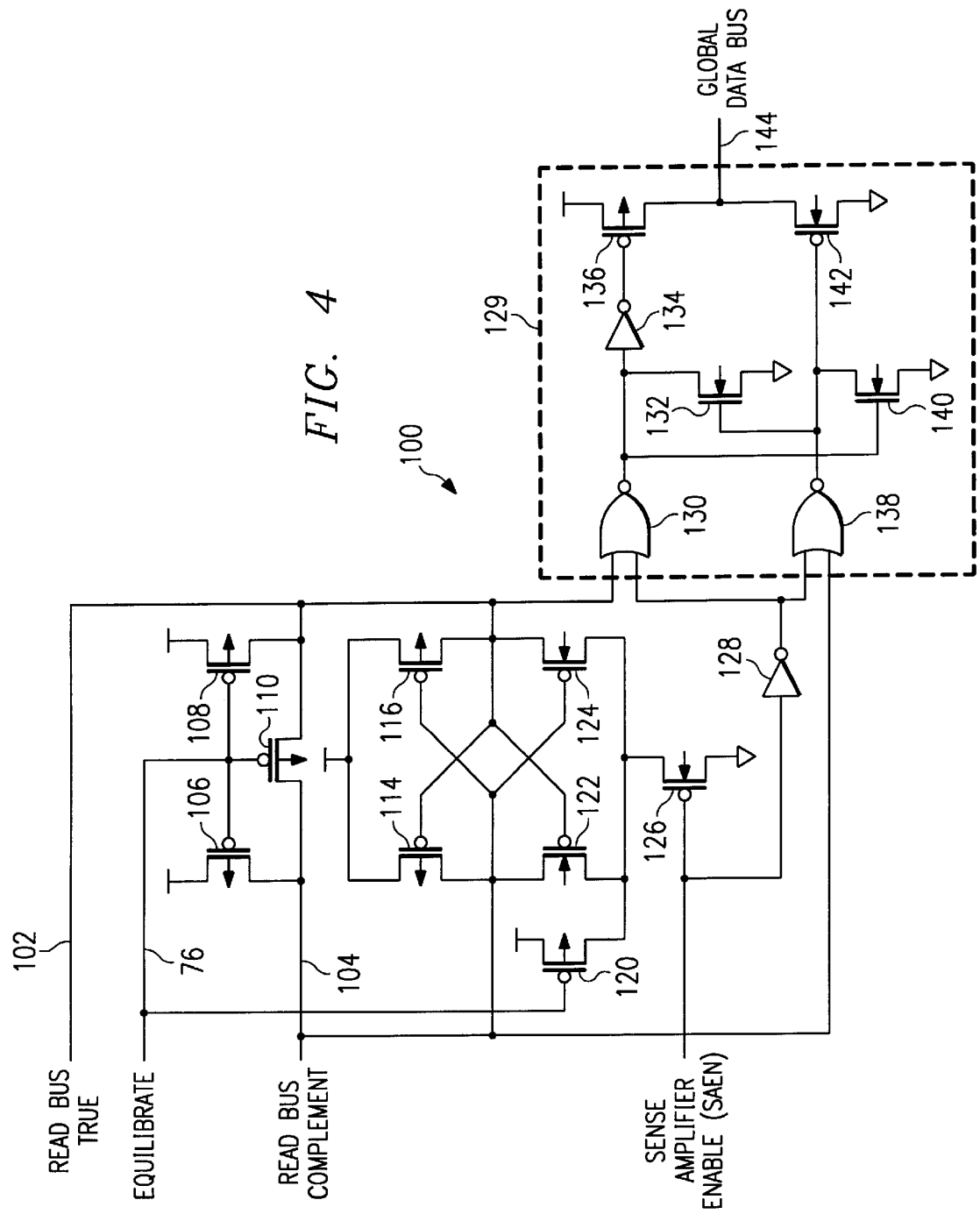

SENSE AMPLIFIER CONTROL OF A MEMORY DEVICE

BACKGROUND OF THE INVENTION

1. Technical Field

The present invention relates generally to Integrated Circuit (IC) memory devices and more specifically to sense amplifier control of synchronous and asynchronous memory devices.

2. Discussion of the Prior Art

On both synchronous and asynchronous IC memory devices, such as SRAM (Static Random Access Memory) devices, dynamic, clocked sense amplifiers are used. Clocked sense amplifiers provide the advantage that they consume no DC current and thus the power consumed by the IC memory device is kept to a minimum. While sense amplifier circuitry has attractive power consumption characteristics, it is incapable of recovering from an initial false sensing and therefore must not be clocked too early. False sensing is usually prevented by designing in signal margin for the sense amplifier circuitry of the memory device. The sense amplifier signal margin determines the amount of differential signal input to the sense amplifier that is allowed to develop before the sense amplifier is clocked. The sense amplifier signal margin of the memory device prevents false sensing of the device.

The sense amplifier signal margin of a memory device is commonly defined internal to the memory device. During the design phase of the memory device, a suitable sense amplifier signal margin is selected. Since the sense amplifier signal margin of a memory device is clocked internal to the memory device, it is not subject to external control or modification.

While internally controlled clocking of the sense amplifier circuitry ensures that the selected sense amplifier signal margin of the memory device is not violated, it does not, of course, allow for flexibility as to when the sense amplifier circuitry is clocked. There are advantages to be gained from being able to selectively clock the sense amplifier circuitry of a memory device. More aggressive device timings could be emulated and a faster or a slower setting of the memory device could be accordingly set. This could be accomplished by appropriate exercise of a fuse option, for instance. Also, selective clocking of the sense amplifier circuitry could be used as a stress test to identify weak bits that could then be repaired through the use of redundant elements. Additionally, selective clocking could be employed to determine the performance limits of a device.

Internally controlled clocking of the sense amplifier circuitry of a memory device does not allow these advantages to be realized. There is therefore a need in the art to be able to externally control the clocking of sense amplifiers of a memory device, external to the memory device.

SUMMARY OF THE INVENTION

It is object of the invention to externally control the clocking of sense amplifiers of a memory device.

Therefore, according to the present invention, a test mode can be invoked that varies the sense amplifier clocking of a memory device based on control of a signal external to the memory device. At the appropriate logic state of a test mode enable signal, the test mode of the memory device is entered. Normal clocking of the sense amplifier is suspended during the test mode and the sense amplifier is clocked according to the transition of an external control signal. Clocking of the sense amplifier tracks the transition of the external control signal from a first logic state to a second logic state. Thus, as the transition of the external control signal is moved relative to a clock signal of the memory device, in the case of a synchronous memory device, or relative to an address signal of the memory device, in the case of an asynchronous memory device, the clocking of the sense amplifier circuitry relative to the clock signal or address signal, respectively, is correspondingly moved.

External control of sense amplifier clocking provides several advantages of the internally controlled clocking of the prior art. More aggressive timings can be emulated and a faster or a slower setting of the device can be set. This could be accomplished by appropriate exercise of a fuse option, for instance. Also, selective clocking of the sense amplifiers can be used as a stress test to identify weak bits that can then be repaired through the use of redundant elements. Additionally, selective clocking can be employed to determine the performance limits of a device.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

FIG. 4 is a schematic diagram of sense amplifier circuitry, according to the present invention.

DESCRIPTION OF THE INVENTION

The present invention provides a method and structure to accomplish external control of the clocking of sense amplifiers of a memory device. As used in this document, the term "clocking" of a sense amplifier refers at the very least to amplifying a differential input signal provided to the sense amplifier; it may additionally include latching a data state of the sense amplifier. An external control signal is used to control sense amplifier clocking of the memory device. The memory device may be a synchronous or asynchronous memory device, such as a SRAM.

Figure 1:
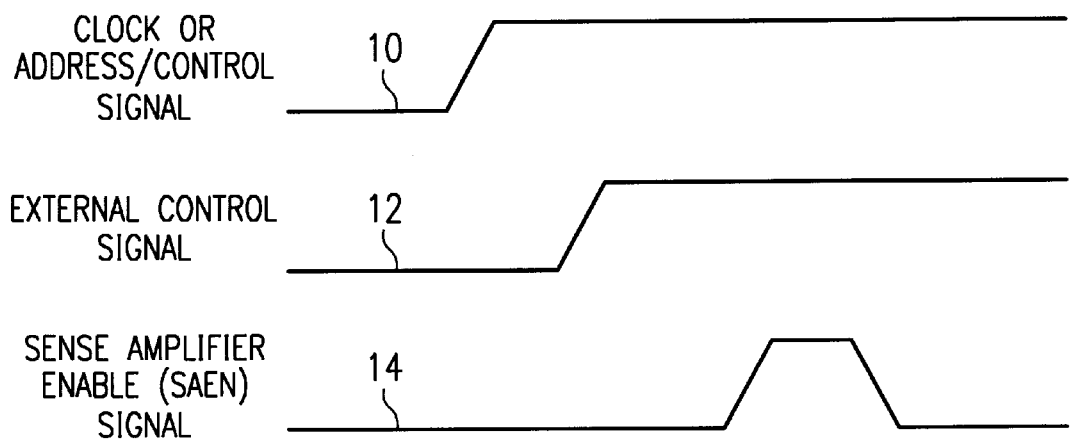
FIG. 1 is a timing diagram illustrating the use of an external control signal to control clocking of sense amplifiers of a SRAM device, according to the present invention.

According to the present invention, a test mode can be invoked that varies the sense amplifier clocking of a memory device based on control external to the memory device. Referring to FIG. 1, a timing diagram illustrates the use of an external control signal to control clocking of the sense amplifiers of a memory device. The Sense Amplifier Enable (SAEN) signal 14 is the sense amplifier clocking signal that controls clocking of the sense amplifiers of the memory device. As demonstrated in FIG. 1, Sense Amplifier Enable (SAEN) signal 14 does not pulse until External Control signal 12 transitions from a first logic state to a second logic state—in this illustration from a low logic state to a high logic state. The transition of the Clock (K) or Address signal 10 itself is not enough to cause Sense Amplifier Enable (SAEN) signal 14 to pulse.

As illustrated in FIG. 1, an external signal controls sense amplifier clocking of the memory device. External Control signal 12 may be any number of signals external to the memory device capable of being externally controlled. For instance, External Control signal 12 may be a Block Write signal or an Output Enable signal of a memory SRAM device.

Figure 2:
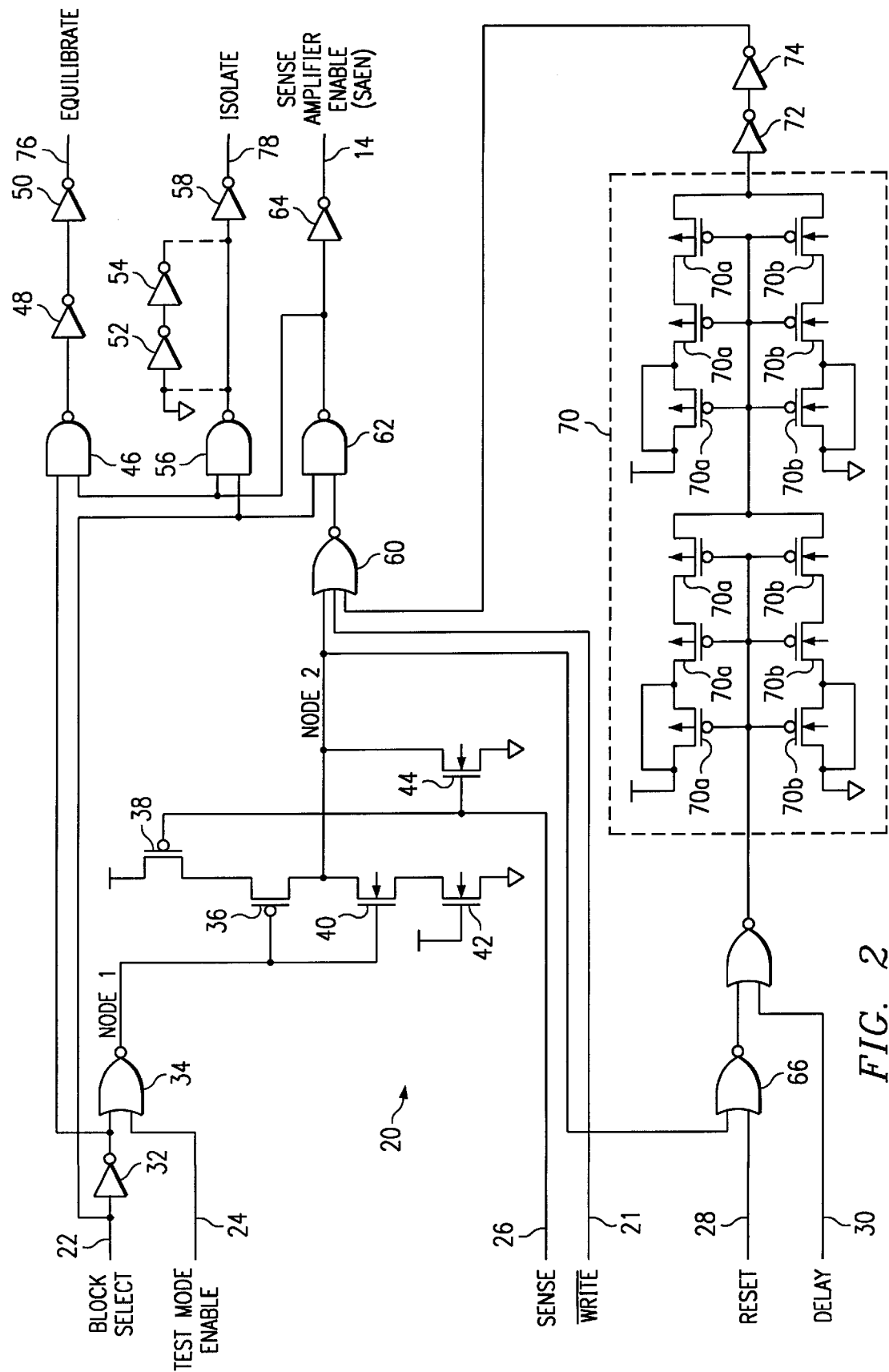
FIG. 2 is a block control circuit of a memory device, according to the present invention.

Sense Amplifier Enable (SAEN) signal 14 is generated by the Block Control Circuit 20 shown in FIG. 2. It must be noted that Block Control Circuit 20 operates as a sense amplifier control circuit that additionally has block control characteristics. Block Control Circuit 20 receives the following input signals: Write Bar signal 21, Block Select signal 22, Test Mode Enable signal 24, Sense signal 26, Reset signal 28, and Delay signal 30. Output signals Equilibrate signal 76, Isolate signal 78, and Sense Amplifier Enable (SAEN) signal 14 are generated by Block Control Circuit 20. In addition, Block Control Circuit 20 has the following elements: inverters 32, 48, 50, 52, 54, 58, 64, 72, and 74; NOR logic gates 34, 60, 66, and 68; NAND logic gates 46, 56, and 62; transistors 36, 38, 40, 42, and 44; and delay element 70 comprised of p-channel transistors 70a and n-channel transistors 70b.

Figure 3:
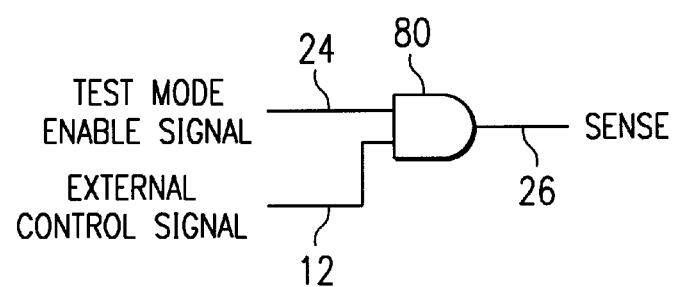
FIG. 3 illustrates a logic function that may be performed to generate the Sense signal of the present invention.

The importance of Block Control circuit 20 to the present invention is that it generates Sense Amplifier Enable (SAEN) signal 14 that is used to clock the sense amplifiers of the memory device. Block Select signal 22 and Test Mode Enable 24 are gated by logic gate 34 to generate a signal at Node 1 that controls the gate of transistor 36 and the gate of transistor 40. The gate of transistor 38 and the gate of transistor 44 are controlled by Sense signal 26. Sense signal 26 is generated by performing a logic operation on Test Mode Enable signal 24 and External Control signal 12 by AND gate 80 as shown in FIG. 3.

It is important that during the test mode of the device when Test Mode Enable signal 24 is a high logic state, clocking of the sense amplifier is based upon the transition of Clock signal 10, in the case of a synchronous memory device, or upon the transition of Address or Control signal 10, in the case of an asynchronous memory device. Thus, in the normal mode, the Sense Amplifier circuitry 200 is clocked a predetermined period of time after the transition of signal 10. Transistor 44 is controlled by Sense signal 26 and not by Block Select signal 22. However, in the normal operating mode of the memory device when Test Mode Enable signal 24 is a low logic state, Block Select signal 22 controls Node 2. Transistors 40 and 42 operate as an inverter and in doing so mimics a memory cell of the memory device. Transistor 40 operates as a passgate of the memory cell of the memory device while transistor 42 operates as a pull-down transistor of the memory cells.

The signal at Node 2 and Reset signal 28 are inputs to NOR gate 66. The output of NOR gate 66 and Delay signal 30 are input signals to NOR gate 68. The output of NOR gate 68 is connected to delay element 70 that is comprised of p-channel transistors 70a and n-channel transistors 70b as shown. Delay signal 30 controls NOR gate 68 to selectively speed up or slow down the sense amplifier of the memory device. The output of delay element 70, after passing through delay inverters 72 and 74, along with the signal at Node 2 and Write bar signal 21, are input signals of logic gate 60. The output of logic gate 60 is passed to logic gate 62 that also has Block Select signal 22 as an input signal. The output signal of logic gate 62 is inverted by inverter 64 which produces Sense Amplifier Enable (SAEN) signal 14.

The output of logic gate 62 is an input signal of logic gate 46; inverted Block Select signal 22 is the second input signal of logic gate 46. The output signal of logic gate 46 generates Equilibrate signal 76. Equilibrate signal 76 operates to precharge and equilibrate the sense amplifiers of the memory device in the manner known in the art. The output of logic gate 62 is also an input signal of logic gate 56. The output signal of logic gate 56 is inverted by inverter 58 to produce Isolate signal 78. Inverters 52 and 54 may be added if it is desired to delay Isolate signal 78. Isolate signal 78 isolates the bitlines of the memory device from the sense amplifier circuitry by turning off the passgate that connects the bitlines to the Read Bus True 102 and Read Bus Complement 104 signals, shown in FIG. 4, to the sense amplifier circuitry.

Referring now to FIG. 4, Sense Amplifier circuitry 200 is illustrated. Sense Amplifier circuitry 200 receives Equilibrate signal 76 and Sense Amplifier Enable (SAEN) signal 14 generated by Block Control circuit 20 of FIG. 2. In addition, Sense Amplifier circuitry 200 receives Read Bus True signal 102 and Read Bus Complement signal 104. Read Bus True signal 102 and Read Bus Complement signal 104 are connected to the bitlines of a memory cells through a column decode passgate, as is well known in the art. Sense Amplifier circuitry 20 has transistors 106, 108, 110, 114, 116, 120, 122, 124, 126, 136, 140, and 142; inverters, 128 and 134; and logic gates 130 and 138. Sense Amplifier circuitry 200 generates Global Data Bus. Tri-stateable Driver 129 drives Global Data Bus 144. Transistors 14, 116, 120, 122, and 124 form a clockable latch of Sense Amplifier circuitry 200. The p-channel passgates comprised of transistors 114 and 116 are controlled by Isolate signal 78 of FIG. 2 such that when they start sensing, they are turned off.

In a test mode, the state of external control signal, External Control signal 12, controls the clocking of the sense amplifier of a memory device. Referring back to FIG. 2, when Test Mode Enable signal 24 is high and indicative that the test mode has been entered, then Sense signal 26 follows the external control signal, External Control signal 12. In the test mode, Test Mode Enable signal 24 is a high logic state, Node 1 is forced low. Additionally, Delay signal 30 is also a high logic state, causing Node 2 to control NOR gate 60 such that the delay introduced by delay element 70 is disabled. This condition allows Sense Amplifier Enable (SAEN) signal 14 to go to a high logic state capable of clocking the sense amplifier of FIG. 4. Conversely, when Test Mode Enable signal 24 is a low logic state, the memory device is not in the test mode, thereby allowing Block Select signal 22 to control Node 1 in the normal manner.

Whether the sense amplifier of FIG. 4 will be clocked in a normal operating mode or a test mode is determined by NOR gate 34 which gates Block Select signal 22 and Test Mode Enable signal 24 as shown in FIG. 2. When Test Mode Enable signal 24 is a high logic state, the test mode is entered and normal clocking of the sense amplifier is blocked. In the test mode, the sense amplifier is clocked according to a transition of External Control signal 12 as illustrated in FIG. 1. Thus, clocking of the sense amplifier tracks the transition of External Control signal 12 from a first logic state to a second logic state on an external pin of the memory device. As External Control signal 12 is moved relative to Clock signal 10, in the case of a synchronous memory device, or relative to Address or Control signal 10, in the case of an asynchronous memory device, the clocking of the sense amplifier is correspondingly moved with respect to the start of the Clock or Address cycle, respectively. Manipulation of External Control signal 12 relative to signal 10 selectively allows more or less differential input signal to the sense amplifier to develop prior to clocking the sense amplifier circuitry.

External control of sense amplifier clocking provides several advantages of the internally controlled clocking of the prior art. More aggressive timings can be emulated and a faster or a slower setting of the device can be set. This could be accomplished by appropriate exercise of a fuse option, for instance, that could enhance speed distribution of manufactured devices. Also, selective clocking of the sense amplifiers can be used as a stress test to identify weak bits that can then be repaired through the use of redundant elements. Additionally, selective clocking can be employed to determine the performance limits of a device. Selective clocking of the device sense amplifiers can also be used for yield analysis of failing bits of the device.

While the invention has been particularly shown and described with reference to a preferred embodiment, it will be understood by those skilled in the art that various changes in form and detail may be made therein without departing from the spirit and scope of the invention.

What is claimed is:

1. A method for controlling clocking of a sense amplifier circuit of a memory device external to the memory device, comprising the steps of:

entering a test mode of the memory device;

transitioning an external control signal received by the memory device from a first logic state to a second logic state; and after a predetermined period of time following transition of the external control signal from the first logic state to the second logic state, clocking the sense amplifier circuit of the memory device, wherein during the test mode of the memory device, clocking of the sense amplifier circuit according to a normal mode of the memory device is suspended.

2. A method for controlling clocking of a sense amplifier circuit of a memory device external to the memory device, comprising the steps of:

entering a test mode of the memory device;

transitioning an external control signal received by the memory device from a first logic state to a second logic state; and after a predetermined period of time following transition of the external control signal from the first logic state to the second logic state, clocking the sense amplifier circuit of the memory device, wherein moving the transition of the external control signal relative to a cycle signal of the memory device moves the clocking of the sense amplifier circuit relative to the cycle signal.

3. The method of claim 2, wherein during the test mode of the memory device, clocking of the sense amplifier circuit according to a normal mode of the memory device is suspended.

4. The method of claim 2, wherein the memory device is a synchronous memory device and the cycle signal is a clock signal of the memory device.

5. The method of claim 2, wherein the memory device is an asynchronous memory device and the cycle signal is an address signal of the memory device.

6. The method of claim 2, wherein the memory device is an asynchronous memory device and the cycle signal is a control signal of the memory device.

7. A method for controlling clocking of a sense amplifier circuit of a memory device external to the memory device, comprising the steps of:

entering a test mode of the memory device;

moving a transition of an external control signal received by the memory device, from a first logic state to a second logic state, relative to a cycle signal of the memory device;

after a predetermined period of time following the transition of the external control signal from the first logic state to the second logic state, clocking the sense amplifier circuit of the memory device, wherein clocking the sense amplifier circuit tracks the transition of the external control signal and the step of moving the transition of the external control signal relative to the cycle signal correspondingly moves the clocking of the sense amplifier circuit relative to the cycle signal.

8. The method of claim 7, wherein moving the transition of the external control signal relative to the cycle signal of the memory device allows a pass/fail signal margin of the sense amplifier circuit at which the memory device begins to output erroneous data upon a read cycle of the memory device to be determined.

9. The method of claim 8, wherein when the pass/fail signal margin of the sense amplifier circuit is determined, clocking of the sense amplifier circuit is fixed to prevent the memory device from outputting erroneous data upon a read cycle of the memory device.

10. The method of claim 7, wherein during the test mode of the memory device, clocking of the sense amplifier circuit according to a normal mode of the memory device is suspended.

11. The method of claim 7, wherein the memory device is a synchronous memory device and the cycle signal is a clock signal of the memory device.

12. The method of claim 7, wherein the memory device is an asynchronous memory device and the cycle signal is an address signal of the memory device.

13. A method for controlling clocking of a sense amplifier circuit of a memory device external to the memory device, comprising the steps of:

entering a test mode of the memory device;

fixing a transition of an external control signal received by the memory device, from a first logic state to a second logic state, relative to a cycle signal of the memory device;

testing the memory device to identify failing bits of the memory device; and repairing the failing bits by replacing the failing bits with redundant elements.

14. Circuitry of a memory device that provides for external control of clocking of a sense amplifier of the memory device, comprising:

a sense amplifier control circuit, provided with a test mode enable signal and a control signal, that generates a sense amplifier enable signal, wherein the control signal is generated by gating an external control signal with the test mode enable signal; and a sense amplifier circuit that receives the sense amplifier enable signal generated by the sense amplifier control circuit, wherein the sense amplifier enable signal is capable of clocking the sense amplifier circuit, wherein when the memory device is in a test mode as defined by the test mode enable signal, a transition of the control signal from a first logic state to a second logic state causes the sense amplifier enable signal to clock the sense amplifier circuit a predetermined period of time after the control signal transitions from the first logic state to the second logic state.

15. Circuitry of a memory device that provides for external control of clocking of a sense amplifier of the memory device, comprising:

a sense amplifier control circuit, provided with a block select signal, a test mode enable signal, and a control signal, that generates a sense amplifier enable signal and an equilibrate signal; and a sense amplifier circuit that receives the sense amplifier enable signal and the equilibrate signal generated by the sense amplifier control circuit, wherein the sense amplifier enable signal is capable of clocking the sense amplifier circuit and the equilibrate signal precharges and equilibrates the sense amplifier circuit, wherein when the memory device is in a test mode as defined by the test mode enable signal, a transition of the control signal from a first logic state to a second logic state causes the sense amplifier enable signal to clock the sense amplifier circuit a predetermined period of time after the control signal transitions from the first logic state to the second logic state.

16. The circuitry of claim 15, wherein the control signal is generated by gating an external control signal with the test mode enable signal.

17. The circuitry of claim 15, wherein when the memory device is in a normal mode as defined by the test mode enable signal, the block select signal controls when the sense amplifier enable signal clocks the sense amplifier circuit.

18. The circuitry of claim 15, wherein the sense amplifier control circuit comprises:

a first logic element, having the block select signal as a first input signal and the test mode enable signal as a second input signal, that generates an output signal at a first node;

a first transistor having a gate controlled by the output signal of the first logic element, a first terminal connected to a first voltage supply and a second terminal;

a second transistor having a gate controlled by the control signal, a first terminal connected to the first voltage supply, and a second terminal connected to the first terminal of the first transistor;

a third transistor having a gate controlled by the output signal of the first logic element, a first terminal connected to the second terminal of the first transistor, and a second terminal;

a fourth transistor having a gate connected to the first voltage supply, a first terminal connected to the second terminal of the third transistor, and a second terminal connected to a second voltage supply;

a fifth transistor having a gate controlled by the control signal, a first terminal connected to the first terminal of the third transistor, and the second terminal connected to the second voltage supply, wherein the electrical connection of the second terminal of the first transistor, the first terminal of the third transistor, and the first terminal of the fifth transistor define a second node;

a second logic element, having the signal at the second node as a first input signal and a write control signal as a second input signal, that generates an output signal;

a third logic element, having the output signal of the second logic element as a first input signal and the block select signal as a second input signal, that generates the sense amplifier enable signal; and a fourth logic element, having the block select signal inverted as a first input signal and the sense amplifier enable signal as a second input signal, that generates the equilibrate signal.

19. The circuitry of claim 18, wherein the sense amplifier control circuit further comprises a delay path, comprising:

a fifth logic element, having the signal at node 2 as a first input signal and a reset signal as a second input signal, that generates an output signal;

a sixth logic element, having the output signal of the fifth logic element as a first input signal and a delay signal as a second input signal, that generates an output signal;

a delay element, having the output signal of the sixth logic element as an input signal, that generates a delay output signal that is a third input signal of the second logic element.

20. The circuitry of claim 19, wherein the sense amplifier control circuit further comprises:

a seventh logic element, having the sense amplifier enable signal as a first input signal and the block select signal as a second input signal, that generates an isolate signal.

21. The circuitry of claim 15, wherein the sense amplifier circuit comprises:

a first transistor having a gate controlled by the equilibrate signal, a first terminal connected to the first voltage supply, and a second terminal connected to a read bus complement signal;

a second transistor having a gate controlled by the equilibrate signal, a first terminal connected to the read bus complement signal, and a second terminal connected to a read bus true signal;

a third transistor having a gate controlled by the equilibrate signal, a first terminal connected to the first voltage supply, and a second terminal connected to the read bus true signal;

a clockable latch controlled by the equilibrate signal, the read bus true signal and the read bus complement signal;

a fourth transistor having a gate controlled by the sense amplifier enable signal, a first terminal connected to the clockable latch of the memory device, and a second terminal connected to the second voltage supply; and a tri-stateable driver, having the read bus true signal as a first input signal and the read bus complement signal as a second input signal, and having an output signal that drives a global data bus of the memory device.

22. The circuitry of claim 21, wherein the clockable latch comprises:

a fifth transistor having a first terminal connected to the first voltage supply, a gate connected to the read bus true signal, and a second terminal connected to the read bus complement signal;

a sixth transistor having a first terminal connected to the first voltage supply, a gate connected to the read bus complement signal, and a second terminal connected to the read bus true signal;

a seventh transistor having a first terminal connected to the first voltage supply, a gate controlled by the equilibrate signal, and a second terminal connected to the first terminal of the fourth transistor;

an eighth transistor having a first terminal connected to the read bus complement signal, a gate connected to the read bus true signal, and a second terminal connected to the first terminal of the fourth transistor; and a ninth transistor having a first terminal connected to the read bus true signal, a gate connected to the read bus complement signal, and a second terminal connected to the first terminal of the fourth transistor.

23. The circuitry of claim 21, wherein the tri-stateable driver further receives the sense amplifier enable signal as a third input signal.

24. The circuitry of claim 23, wherein the tri-stateable driver of the sense amplifier circuit comprises:

a first logic element, having the read bus true as a first input signal and the sense amplifier enable signal as a second input signal, that generates an output signal;

a second logic element, having the read bus complement as a first input signal and the sense amplifier enable signal as a second input signal, that generates an output signal;

a fifth transistor having a gate controlled by the output signal of the second logic element, a first terminal connected to the output signal of the first logic element, and a second terminal connected to the second voltage supply;

a sixth transistor having a gate controlled by the output signal of the first logic element and the first terminal of the fifth transistor, a first terminal connected to the first voltage supply, and a second terminal;

a seventh transistor having a gate controlled by the output signal of the first logic element, a first terminal connected to the output signal of the second logic element and the gate of the fifth transistor, and a second terminal connected to the second voltage supply; and an eighth transistor having a gate controlled by the output signal of the second logic element, a first terminal connected to the second terminal of the sixth transistor to form the output signal of the tri-stateable driver that drives the global data bus, and a second terminal connected to second voltage supply.

25. The circuitry of claim 15, wherein the sense amplifier control circuit comprises:

a first logic element, having the block select signal as a first input signal and the test mode enable signal as a second input signal, that generates an output signal at a first node;

a first transistor having a gate controlled by the output signal of the first logic element, a first terminal connected to a first voltage supply and a second terminal;

a second transistor having a gate controlled by the control signal, a first terminal connected to the first voltage supply, and a second terminal connected to the first terminal of the first transistor;

a third transistor having a gate controlled by the output signal of the first logic element, a first terminal connected to the second terminal of the first transistor, and a second terminal;

a fourth transistor having a gate connected to the first voltage supply, a first terminal connected to the second terminal of the third transistor, and a second terminal connected to a second voltage supply;

a fifth transistor having a gate controlled by the control signal, a first terminal connected to the first terminal of the third transistor, and the second terminal connected to the second voltage supply, wherein the electrical connection of the second terminal of the first transistor, the first terminal of the third transistor, and the first terminal of the fifth transistor define a second node;

a second logic element, having the signal at the second node as a first input signal and a write control signal as a second input signal, that generates an output signal;

a third logic element, having the output signal of the second logic element as a first input signal and the block select signal as a second input signal, that generates the sense amplifier enable signal;

a fourth logic element, having the block select signal inverted as a first input signal and the sense amplifier enable signal as a second input signal, that generates the equilibrate signal; and wherein the sense amplifier circuit comprises:

a sixth transistor having a gate controlled by the equilibrate signal, a first terminal connected to the first voltage supply, and a second terminal connected to a read bus complement signal;

a seventh transistor having a gate controlled by the equilibrate signal, a first terminal connected to the read bus complement signal, and a second terminal connected to a read bus true signal;

an eighth transistor having a gate controlled by the equilibrate signal, a first terminal connected to the first voltage supply, and a second terminal connected to the read bus true signal;

a clockable latch controlled by the equilibrate signal, the read bus true signal and the read bus complement signal;

a ninth transistor having a gate controlled by the sense amplifier enable signal, a first terminal connected to the memory cell of the memory device, and a second terminal connected to the second voltage supply; and a tri-stateable driver, having the read bus true signal as a first input signal and the read bus complement signal as a second input signal, and having an output signal that drives a global data bus of the memory device.

26. The circuitry of claim 25, wherein the clockable latch comprises:

a tenth transistor having a first terminal connected to the first voltage supply, a gate connected to the read bus true signal, and a second terminal connected to the read bus complement signal;

an eleventh transistor having a first terminal connected to the first voltage supply, a gate connected to the read bus complement signal, and a second terminal connected to the read bus true signal;

a twelfth transistor having a first terminal connected to the first voltage supply, a gate controlled by the equilibrate signal, and a second terminal connected to the first terminal of the ninth transistor;

a thirteenth transistor having a first terminal connected to the read bus complement signal, a gate connected to the read bus true signal, and a second terminal connected to the first terminal of the ninth transistor; and a fourteenth transistor having a first terminal connected to the read bus true signal, a gate connected to the read bus complement signal, and a second terminal connected to the first terminal of the ninth transistor.

27. The circuitry of claim 25, wherein the tri-stateable driver further receives the sense amplifier enable signal as a third input signal.

28. The circuitry of claim 25, wherein the tri-stateable driver of the sense amplifier circuit comprises:

a fifth logic element, having the read bus true as a first input signal and the sense amplifier enable signal as a second input signal, that generates an output signal;

a sixth logic element, having the read bus complement as a first input signal and the sense amplifier enable signal as a second input signal, that generates an output signal;

a tenth transistor having a gate controlled by the output signal of the sixth logic element, a first terminal connected to the output signal of the fifth logic element, and a second terminal connected to the second voltage supply;

an eleventh transistor having a gate controlled by the output signal of the fifth logic element and the first terminal of the tenth transistor, a first terminal connected to the first voltage supply, and a second terminal;

a twelfth transistor having a gate controlled by the output signal of the fifth logic element, a first terminal connected to the output signal of the sixth logic element and the gate of the tenth transistor, and a second terminal connected to the second voltage supply; and a thirteenth transistor having a gate controlled by the output signal of the sixth logic element, a first terminal connected to the second terminal of the eleventh transistor to form the output signal of the tri-stateable driver that drives the global data bus, and a second terminal connected to second voltage supply.

29. The circuitry of claim 25, wherein the sense amplifier control circuit further comprises a delay path, comprising:

a fifth logic element, having the signal at node 2 as a first input signal and a reset signal as a second input signal, that generates an output signal;

a sixth logic element, having the output signal of the fifth logic element as a first input signal and a delay signal as a second input signal, that generates an output signal;

a delay element, having the output signal of the sixth logic element as an input signal, that generates a delay output signal that is a third input signal of the second logic element.

30. The circuitry of claim 29, wherein the sense amplifier control circuit further comprises:

a seventh logic element, having the sense amplifier enable signal as a first input signal and the block select signal as a second input signal, that generates an isolate signal.

* * * * *

UNITED STATES PATENT AND TRADEMARK OFFICE

CERTIFICATE OF CORRECTION

PATENT NO.    :    5,959,910

DATED         :    9/28/99

INVENTOR(S)   :    McClure

It is certified that error appears in the above-identified patent and that said Letters Patent is hereby corrected as shown below:

In claim 18, at column 7, lines 33-34, the words " connected to a first voltage supply" should be deleted.

In claim 25, at column 9, lines 37-38, the words ``connected to a first voltage supply'' should be deleted.

Signed and Sealed this

Twelfth Day of December, 2000

*Attest:*

*Attesting Officer*

Q. TODD DICKINSON

*Director of Patents and Trademarks*